United States Patent
Chen et al.

(10) Patent No.: US 8,205,036 B2
(45) Date of Patent: Jun. 19, 2012

(54) NON-VOLATILE MEMORY AND CONTROLLING METHOD THEREOF

(75) Inventors: Ming-Dar Chen, Taipei (TW); Hsiang-An Hsieh, Taipei (TW); Chuan-Sheng Lin, Taipei (TW)

(73) Assignee: A-Data Technology (Suzhou) Co., Ltd., Suzhou, Jiangsu Province (CN)

( * ) Notice: Subject to any disclaimer, the term of this patent is extended or adjusted under 35 U.S.C. 154(b) by 197 days.

(21) Appl. No.: 12/509,287

(22) Filed: Jul. 24, 2009

(65) Prior Publication Data

US 2010/0037006 A1 Feb. 11, 2010

(30) Foreign Application Priority Data

Aug. 5, 2008 (CN) .......................... 2008 1 0021556

(51) Int. Cl.
*G06F 12/00* (2006.01)

(52) U.S. Cl. ............ 711/103; 711/E12.008; 365/185.29

(58) Field of Classification Search .................. 711/103, 711/E12.008

See application file for complete search history.

(56) References Cited

U.S. PATENT DOCUMENTS

| | | | |
|---|---|---|---|
| 5,270,979 A * | 12/1993 | Harari et al. | 365/185.09 |
| 6,230,233 B1 | 5/2001 | Lofgren et al. | |
| 6,345,001 B1 * | 2/2002 | Mokhlesi | 365/185.33 |
| 6,732,221 B2 | 5/2004 | Ban | |
| 2003/0165076 A1 * | 9/2003 | Gorobets et al. | 365/200 |
| 2004/0153902 A1 * | 8/2004 | Machado et al. | 714/710 |
| 2005/0204187 A1 * | 9/2005 | Lee et al. | 714/8 |
| 2007/0208904 A1 * | 9/2007 | Hsieh et al. | 711/103 |

\* cited by examiner

*Primary Examiner* — Kevin Verbrugge
*Assistant Examiner* — Victor Wang
(74) *Attorney, Agent, or Firm* — Cheng-Ju Chiang

(57) ABSTRACT

A non-volatile memory of present invention includes a number of memory blocks and a static wear leveling device. The static wear leveling device includes a memory unit for storing the erase counts of the memory blocks and a controlling unit for getting the erase counts from the memory unit, and calculating the standard deviation based on the EC, and deciding the way of the static wear leveling cycle according to the standard deviation. The controlling unit deciding the way of the static wear leveling cycle include the steps of setting at least one predetermined threshold point and judging whether the standard deviation of the erase counts is smaller than the predetermined threshold point. If the standard deviation of the erase counts is smaller than the predetermined threshold point, the static wear leveling cycle starts for a first amount of cycles and moves the static data stored a first number of memory blocks. If the standard deviation of the erase counts is bigger than the predetermined threshold point, starts for a second amount of cycles and moves the static data stored a second number of memory blocks.

5 Claims, 9 Drawing Sheets

NON-VOLATILE MEMORY AND CONTROLLING METHOD THEREOF

CROSS-REFERENCE TO RELATED APPLICATIONS

This application claims priority to and the benefit of Chinese Patent Application No. 200810021556.3 filed in the State Intellectual Property Office of P.R.C. (SIPO) on Aug. 5, 2008, the entire contents of which are incorporated herein by reference.

BACKGROUND OF THE INVENTION

1. Field of the Invention

The present invention relates to a non-volatile memory and its controlling method, and more particularly, to a flash memory and a method of controlling erasing of static memory area of the flash memory.

2. Description of the Related Technology

The non-volatile memory has been widely utilized for computing devices and portable electronic equipments. The advantage of the non-volatile memory is that the data stored in the memory is not erased when the power supply to the memory is terminated, and the data can be read again as long as the power supply to the memory resumes. Flash memory, which is one type of the non-volatile memory, has been gradually used as memory units in the computing devices and the portable electronic equipments to replace traditional hard disks, because of its numerous advantages, i.e., low electric power consumption, high speed, no vibration, and portability.

A conventional flash memory device is arranged in a plurality of memory blocks. Each of the memory blocks includes a plurality of memory cells typically arranged in a matrix form. Each of the memory blocks includes bit lines and word lines. The bit lines extend parallel to one another in a column direction. The word lines extend parallel to one another in a row direction perpendicular to the column direction. Each bit line includes a string of memory cells.

Each of the memory cells includes a floating gate transistor. The floating gate transistors of a bit line are coupled to one another in series from source to drain. The control gates of the floating gate transistors of memory cells of a common row are coupled to the same word line. Each of the memory cells stores a charge (or a lack of charge). The amount of stored charge can be used to represent, for example, one or more states, which can represent one or more digits (for example, bits) of data. The charge stored in the floating gate transistor sets the threshold voltage of the floating gate transistor.

In a conventional method of writing data on a memory block, during a write operation, data is typically written on a set of memory cells coupled to a single word line. Such a set of memory cells can be referred to as a "page." In one arrangement, a page may include all memory cells sharing a word line. In other arrangements, a page may be formed by every two memory cells coupled to a single word line. In certain arrangements, a page may be formed by every four memory cells coupled to a single word line. It will be understood that a page may be formed by any suitable selected number of memory cells coupled to a word line. The pages can be used as memory units for reading, writing and erasing data.

During a process of renewing data in a flash memory, memory blocks for storing old data will erase data saved in corresponding memory cells, i.e., the memory cells will take high voltage so as to release electrons. However, the erasing action with high voltage to the memory cell may damage the operating characteristics of the memory cell and rapidly wear the memory cell. As a result, after a certain number of cycles of erasing or rewriting, the memory cells may not correctly save electrons which correspond to data to be stored therein, and consequently error data may be generated when reading or writing new data into the memory blocks of the flash memory.

Normally, data stored in a flash memory is divided into two types: dynamic data and static data. The dynamic data may include data adapted to be rewritten frequently, for instance, a file allocation table. The static data may include data adapted to be rewritten very few times or never rewritten, for instance, a procedure code of the operating system. Therefore, the memory blocks for storing the dynamic data will be used more frequently than the memory blocks for storing the static data and will wear faster than the memory blocks for storing the static data, and consequently will reach its lifetime earlier than the memory blocks for storing the static data. The lifetime of the memory cell can be estimated based on its erasing cycles, normally about 10,000 to about 100,000 times. If the memory blocks in the flash memory cannot be read or rewritten at a relatively average level, some of the memory blocks will reach its lifetime because of more frequent wearing actions. When more and more memory blocks in the flash memory reach their lifetime, the flash memory will be no longer operational. However, other memory blocks may be still operational before reaching their lifetime because of fewer wearing actions, which is not desirable to the overall lifetime of the flash memory.

SUMMARY OF CERTAIN INVENTIVE ASPECTS

In one embodiment, a controlling method for a non-volatile memory having a plurality of memory blocks comprises the step of calculating erase count (EC) of each of the memory blocks, and the step of calculating the standard deviation of the erase counts of the memory blocks to decide the way of a static wear leveling cycle.

In another embodiment, the way of a static wear leveling cycle comprises the step of setting at least one predetermined threshold point, and the step of judging whether the standard deviation of the erase counts is bigger than the predetermined threshold point. If the standard deviation of the erase counts is bigger than the predetermined threshold point, the static wear leveling cycle starts. If the standard deviation of the erase counts is not bigger than the predetermined threshold point, the static wear leveling cycle does not start.

A non-volatile memory according to one embodiment comprises a plurality of memory blocks and a static wear leveling device. The static wear leveling device includes a memory unit for storing the erase counts of the memory blocks and a controlling unit for getting the erase counts from the memory unit, and calculating the standard deviation based on the erase counts, and deciding the way of the static wear leveling cycle according to the standard deviation. The controlling unit decides the way of the static wear leveling cycle comprise the steps of setting at least one predetermined threshold point and judging whether the standard deviation of the erase counts is smaller than the predetermined threshold point. If the standard deviation of the erase counts is smaller than the predetermined threshold point, the static wear leveling cycle starts for a first amount of cycles and moves the static data stored a first number of memory blocks. If the standard deviation of the erase counts is bigger than the predetermined threshold point, starts for a second amount of cycles and moves the static data stored a second number of memory blocks.

According to another embodiment, a non-volatile memory comprises a plurality of memory blocks and a static wear leveling device. The static wear leveling device includes a memory unit for storing the latest erasing time (ET) of the memory blocks, and a controlling unit for getting the latest ET from the memory unit, and finding out a memory block having the earliest ET, and starting the static wear leveling action for the memory block having the earliest ET.

DETAILED DESCRIPTION OF CERTAIN INVENTIVE EMBODIMENTS

Figure 1:
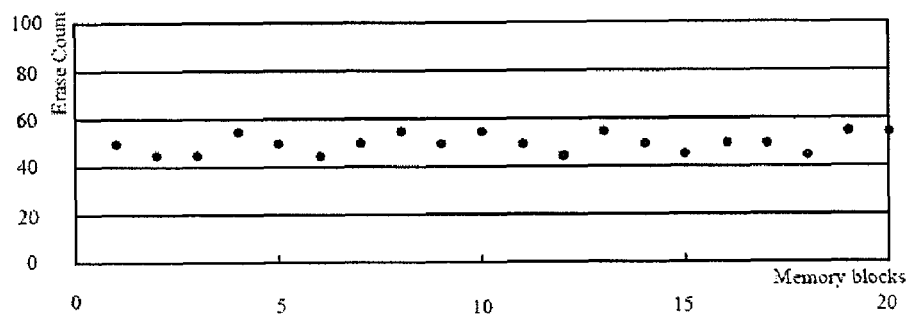
FIG. 1 is a chart showing distributions of erase counts (EC) of the memory blocks in a first condition.

In order to extend the overall lifetime of a flash memory, memory blocks in the flash memory can be erased or rewritten at a relatively average level. Example methods of averagely wearing the memory blocks include a dynamic wear leveling technology and a static wear leveling technology. The dynamic wear leveling technology searches for empty memory blocks which are not used or most infrequently used in the past for storing dynamic data so as to avoid repeatedly erasing or rewriting the memory blocks which have been used for many times in the past. However, the dynamic wear leveling technology can only mostly level the wearing actions of the memory blocks for storing the dynamic data; it does not have a chance to level the memory blocks for storing static data, since the memory blocks for storing static data are always occupied by data adapted to be rewritten very few times or never rewritten.

The static wear leveling technology is developed to level the wearing actions of the memory blocks for storing static data. During a process of writing data, the static wear leveling technology firstly move static data stored in the flash memory from the its original memory blocks to the memory blocks which were most frequently used in the past wearing actions, and then wear the original memory blocks for the static data, and thirdly write the new data into the original memory blocks which were used in the past for the static data. As a result, all the memory blocks in the flash memory, either the memory blocks for the dynamic data or the memory blocks for the static data, can be rewritten or wear at a relatively average level, such that the overall lifetime of the flash memory can be extended.

However, before moving the static data from the memory blocks, the original memory blocks for storing the static data must be identified first. The method may restrict the type of the memory blocks based on the wearing times of corresponding memory blocks. This method has a shortcoming. For instance, considering a flash memory which has finished a first static wear leveling action, the original memory blocks with low wearing times now store the dynamic data which was moved from the memory blocks with high wearing time. Consequently, in a second static wear leveling action, since the current memory blocks for storing the dynamic data have low wearing times, they may be mistaken as the other original memory blocks for storing static data, and therefore the dynamic data stored in these memory blocks may be regarded as static data and be moved out to other memory blocks. Under these circumstances, the memory blocks with low wearing times will always be regarded as the memory blocks for storing static data and rewritten with new data. As a result, the memory blocks with low wearing times will be repeatedly read and rewritten even more frequently than in an instance using the static wear leveling technology, and let the overall lifetime of the flash memory become even shorter. Furthermore, during the process of a static wear leveling cycle, the static data will be moved out from its original memory blocks and new dynamic data will be written in the original memory blocks, the moving-in and moving-out process of the data will take much more time than a simple moving-in process of the data. Therefore, if the static wear leveling cycles occur too frequently, it will influence working efficiency of the flash memory. Examples of wear leveling techniques are disclosed in U.S. Pat. Nos. 6,230,233 and 6,732,221, the disclosures of which are incorporated herein by reference in their entireties.

In some embodiments, in order to improve the accuracy of the static wear leveling technology, the theory of standard deviation used in the statistics field can be used to improve a method of controlling the frequency of static wear leveling cycles.

Standard deviation is a measure of the dispersion of a collection of numbers. A big standard deviation means that many data points are far from the mean (or average value) whereas a small standard deviation means that many data points are close to the mean. The formula of the standard deviation is as follows.

$$\sigma = \sqrt{\frac{1}{N}\sum_{i=1}^{N}(x_i - \bar{x})^2}$$

wherein x1, . . . , xN all real numbers, and the formula of the mean is as follows.

$$\bar{x} = \frac{1}{N}\sum_{i=1}^{N}x_i$$

For instance, the mean of data set {2, 3, 4, 6, 7, 8} and the mean of data set {0, 1, 3, 7, 9, 10} are both 5. However, the standard deviation of data set {2, 3, 4, 6, 7, 8} is 2.16(2.160246899469287) while the standard deviation of data set {0, 1, 3, 7, 9, 10} is 3.87(3.872983346207417). The smaller standard deviation of data set {2, 3, 4, 6, 7, 8} means that the data points in the data set are closer to the mean 5 while the bigger standard deviation of data set {0, 1, 3, 7, 9, 10} means that the data points in the data set are far from the mean 5.

Similarly, in some embodiments, the standard deviation can be used to observe the distribution of erase counts (EC) for memory blocks, and then define how to start the static wear leveling cycle based on different standard deviations. The term "erase count" refers to the number of erase operations to which a memory block has been subjected. The following example shows the distribution of erase counts for twenty memory blocks.

Assume that a first distribution status of erase counts for twenty memory blocks (Memory Block 1-20) in a flash memory after the flash memory has been used for a certain period of time is as shown in Table 1:

TABLE 1

| Memory Block | | | | | | | | | | |
|---|---|---|---|---|---|---|---|---|---|---|
| | 1 | 2 | 3 | 4 | 5 | 6 | 7 | 8 | 9 | 10 |
| Erase Count (EC) | 50 | 45 | 45 | 55 | 50 | 45 | 50 | 55 | 50 | 55 |
| Memory Block | | | | | | | | | | |
| | 11 | 12 | 13 | 14 | 15 | 16 | 17 | 18 | 19 | 20 |
| Erase Count (EC) | 50 | 45 | 55 | 50 | 45 | 50 | 50 | 45 | 55 | 55 |

Figure 2:
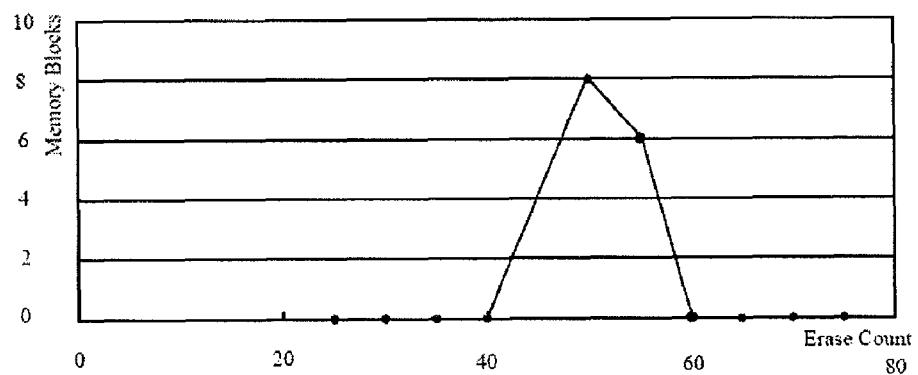
FIG. 2 is a chart showing the relationship between the erase count of FIG. 1 and the number of the memory blocks.

The mean of all erase counts in the above chart is 50 and the corresponding standard deviation is 3.973597. FIG. 1 shows distributions of erase counts. The collecting line of all data points in FIG. 1 is relatively even since all erase counts are very close to the mean 50. FIG. 2 clearly shows the relationship between the number of the memory blocks and erase count. Most of the memory blocks have an erase count close to the mean 50.

Assume that a second distribution status of erase counts for the twenty memory blocks is as shown in Table 2.

TABLE 2

| Memory Block | | | | | | | | | | |
|---|---|---|---|---|---|---|---|---|---|---|
| | 1 | 2 | 3 | 4 | 5 | 6 | 7 | 8 | 9 | 10 |
| Erase Count (EC) | 75 | 35 | 45 | 40 | 70 | 55 | 40 | 65 | 25 | 30 |
| Memory Block | | | | | | | | | | |
| | 11 | 12 | 13 | 14 | 15 | 16 | 17 | 18 | 19 | 20 |
| Erase Count (EC) | 50 | 65 | 70 | 45 | 30 | 50 | 55 | 75 | 60 | 25 |

Figure 3:
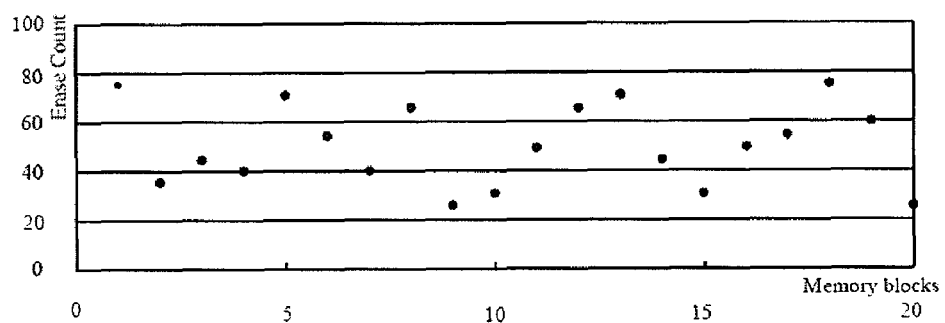
FIG. 3 is a chart showing distributions of erase counts of the memory blocks in a second condition.
Figure 4:
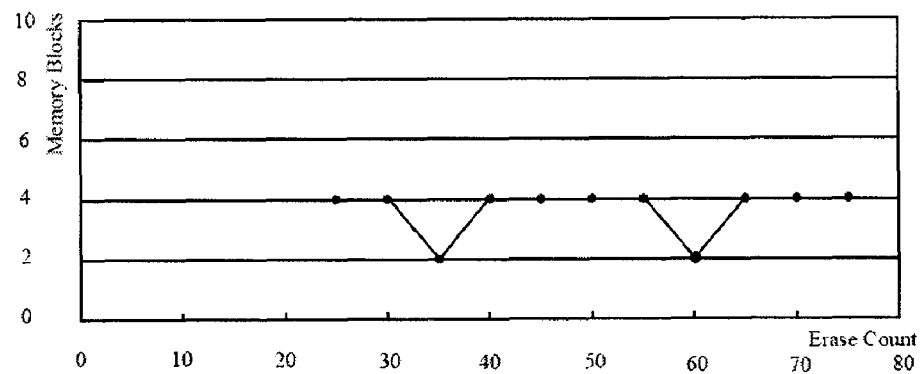
FIG. 4 is a chart showing the relationship between the erase count of FIG. 3 and the number of the memory blocks.

The mean of all erase counts in the above chart is 50.25 and the corresponding standard deviation is 16.50159482. FIG. 3 shows distributions of erase counts. The collecting line of all data points in FIG. 3 is relatively wavy since most of erase counts are far spread from the mean 50.25. FIG. 4 clearly shows the relationship between the number of the memory blocks and erase counts. Most of the memory blocks are far from the mean 50.25.

In summary, the standard deviation 16.50159482 for the second distribution status of erase counts is obviously bigger than the standard deviation 3.97359 for the first distribution status of erase counts. This indicates that the erase counts for the first distribution status is more concentrated than the erase counts for the second distribution status, and correspondingly, the static wear leveling cycles under different distribution status of erase counts can be defined based on the status of the standard deviations. The following example shows how to realize this.

Figure 5:
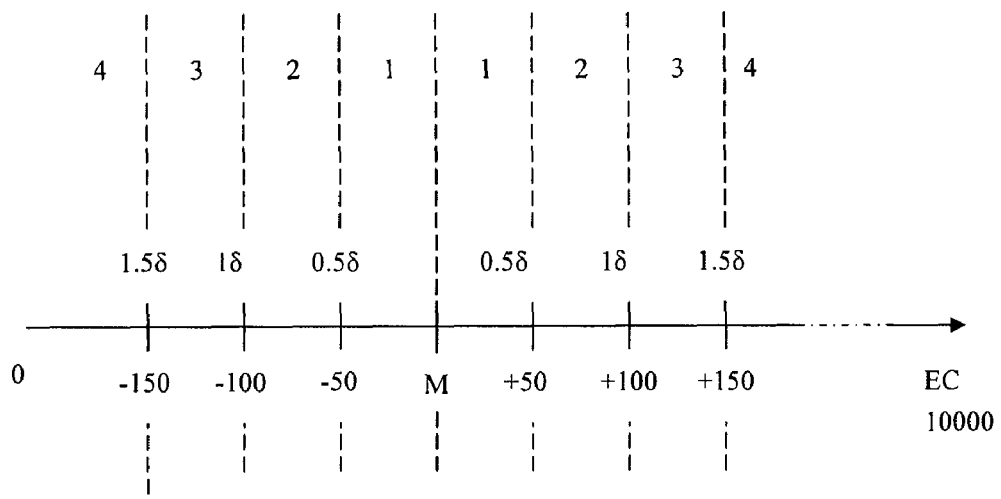
FIG. 5 is a sample chart explaining the different standard deviations.
Figure 6:
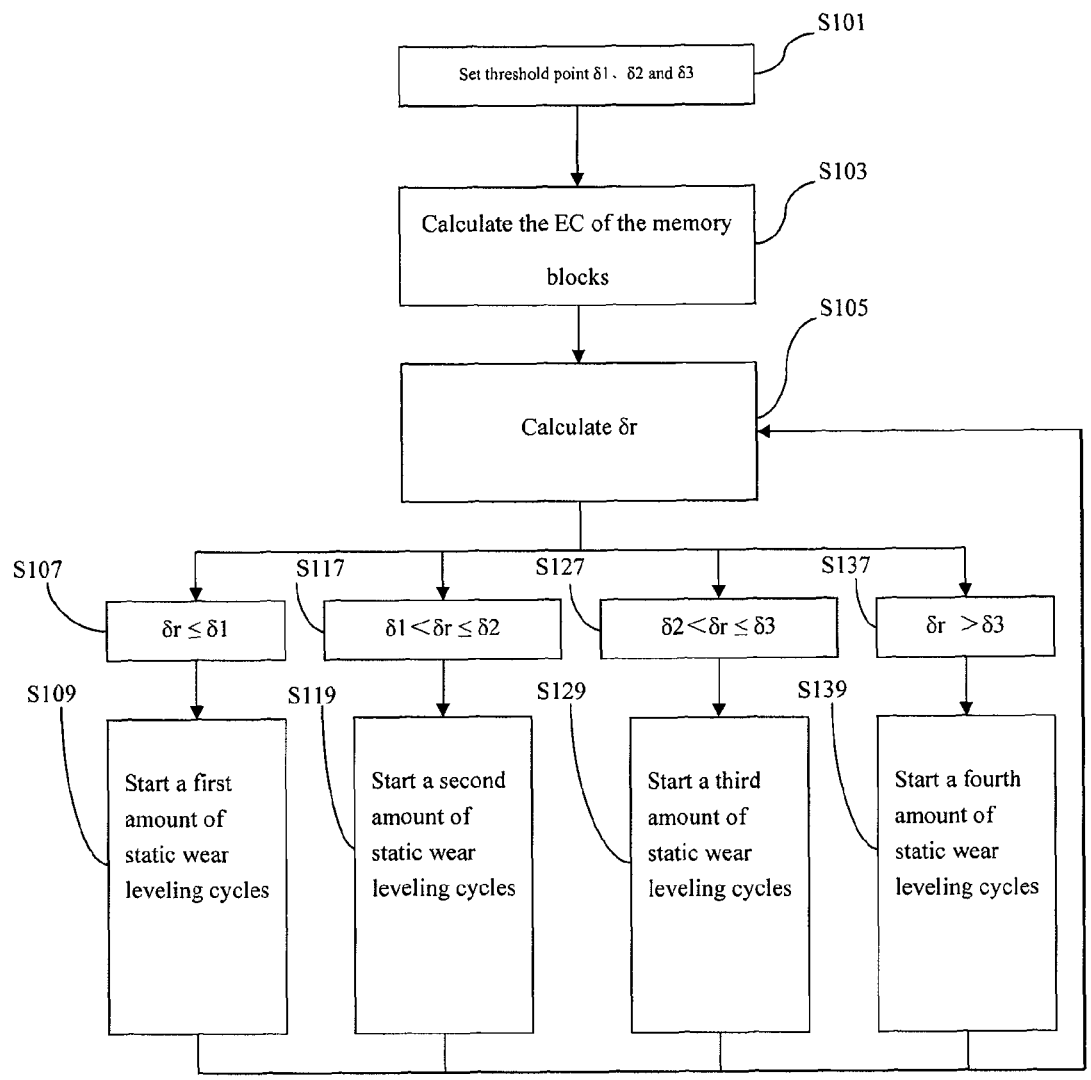
FIG. 6 is a flow chart showing the way of the static wear leveling cycle.

Assume that a flash memory has 1000 memory blocks, and the maximum erase count for the memory cells in the memory blocks are 10,000. Referring to FIGS. 5 and 6, three predetermined threshold points are set: $\delta 1=0.5\%$, $\delta 2=1\%$, and $\delta 3=1.5\%$. Three predetermined erase counts corresponding to the three threshold points are 50, 100, and 150, respectively ($10000\times0.5\%=50$, $10000\times1\%=100$, $1000\times1.5\%=150$). The erase counts, 50, 100, and 150 will be defined as the mean for the three corresponding standard deviations. The three standard deviations will form four action areas. They are respectively numbered as area 1, area 2, area 3 and area 4 in FIG. 5. Based on the above mentioned formula of standard deviation, the actual erase count for each of 1000 memory blocks is calculated so as to obtain the mean M and standard deviation $\delta r$, and then the mean M and standard deviation $\delta r$ are compared with one of the three predetermined erase counts and one of the three threshold points to decide to which action area the memory block belongs. The details of different action areas are described below.

In one embodiment, $\delta 2$ (1%) is defined as a desired set point for standard deviation, i.e., the desired erase count for most of the memory blocks may be between the mean M minus 100 and the mean M plus 100. If the actual erase count is too far from the desired erase count, the static wear leveling action will start so as to redefine the actual erase count to be close to the desired erase count.

If the standard deviation $\delta r$ falls into area 1 in FIG. 6, which means that the actual erase counts of most of memory blocks are between the mean M minus 50 and the mean M plus 50, there is no need to start the static wear leveling cycle. This is because the standard deviation $\delta r$ is much smaller than the desired set point $\delta 2$ (1%) and the actual erase counts of most of the memory blocks are at average or very close to the desired erase count. Thus, it is unnecessary to start the static wear leveling cycle and increase the burden of the flash memory.

If the standard deviation $\delta r$ falls into area 2 in FIG. 6, which means that the actual erase counts of most of memory blocks are between the mean M minus 100 and the mean M plus 100, it may be necessary to start a small number of static wear leveling cycles to balance the uneven distributions of the actual erase counts in different memory blocks of the flash memory. This is because the standard deviation $\delta r$ is very close to the desired set point $\delta 2$ (1%). For instance, the flash memory can start a static wear leveling cycle after the actual erase counts for some memory blocks have reached a first predetermined value (E1) and move the static data stored in the corresponding memory blocks (B1), such that the uneven distributions of the actual erase counts in the memory blocks of the flash memory can be balanced at a certain level.

If the standard deviation $\delta r$ falls into area 3 in FIG. 6, which means that the actual erase counts of most of memory blocks are between the mean M minus 150 and the mean M plus 150, it may be necessary to start the static wear leveling cycles more frequently than the status when $\delta r$ falls into area 2. This is because the standard deviation $\delta r$ has increased beyond the desired set point $\delta 2$ (1%). For instance, the flash memory can start a static wear leveling cycle after the actual erase counts for some memory blocks have reached a second predetermined value (E2, E2<E1) and move the static data stored in the corresponding memory blocks (B2, B2>B1), such that the uneven distributions of the actual erase counts in the memory blocks of the flash memory can be balanced at a desired level.

If the standard deviation δr falls into area 4 in FIG. 6, which means that the actual erase counts of most of memory blocks have been outside the region between the mean M minus 150 and the mean M plus 150, it may be necessary to start the static wear leveling cycles with the greatest frequency. This is because the standard deviation δr is far from the desired set point δ2 (1%). For instance, the flash memory can start a static wear leveling cycle after the actual erase counts for some memory blocks have reached a third predetermined value (E3, E3<E2<E1) and move the static data stored in the corresponding memory blocks (B3, B3>B2>B1), such that the uneven distributions of the actual erase counts in the memory blocks of the flash memory can be balanced as even as possible to extend the overall lifetime of the flash memory.

The above mentioned examples, including the standard deviation set points δ1, δ2 and δ3, corresponding actual erase counts, E1, E2 and E3, and corresponding memory blocks B1, B2 and B3, are only used as examples to explain the features of the above embodiment. The set points can be adjusted in accordance with the actual requirements of the flash memory. Therefore, they cannot be regarded as restrictions to the features of the embodiment.

FIG. 6 shows a flow chart illustrating a method of starting the static wear leveling cycle in accordance with one embodiment. The flow chart includes the following steps. In step S101, the predetermined standard deviation set points δ1, δ2 and δ3 are set in the controlling device of the flash memory. In step S103, the actual erase counts of all memory blocks in the flash memory are calculated. In step S105, the actual standard deviation δr of the memory blocks is calculated.

In steps S107, S117, S127 and S137, the controlling device of the flash memory compares the actual standard deviation δr of the memory blocks with the predetermined standard deviation set points δ1, δ2 and δ3 and defines which scope the actual standard deviation δr should fall into. If δr≦δ1, step S109 will be chosen and the controlling device of the flash memory can start a static wear leveling cycle after the actual erase counts for some memory blocks have reached a zero-th predetermined value (E0) and move the static data stored in the corresponding memory blocks (B0).

Figure 7:
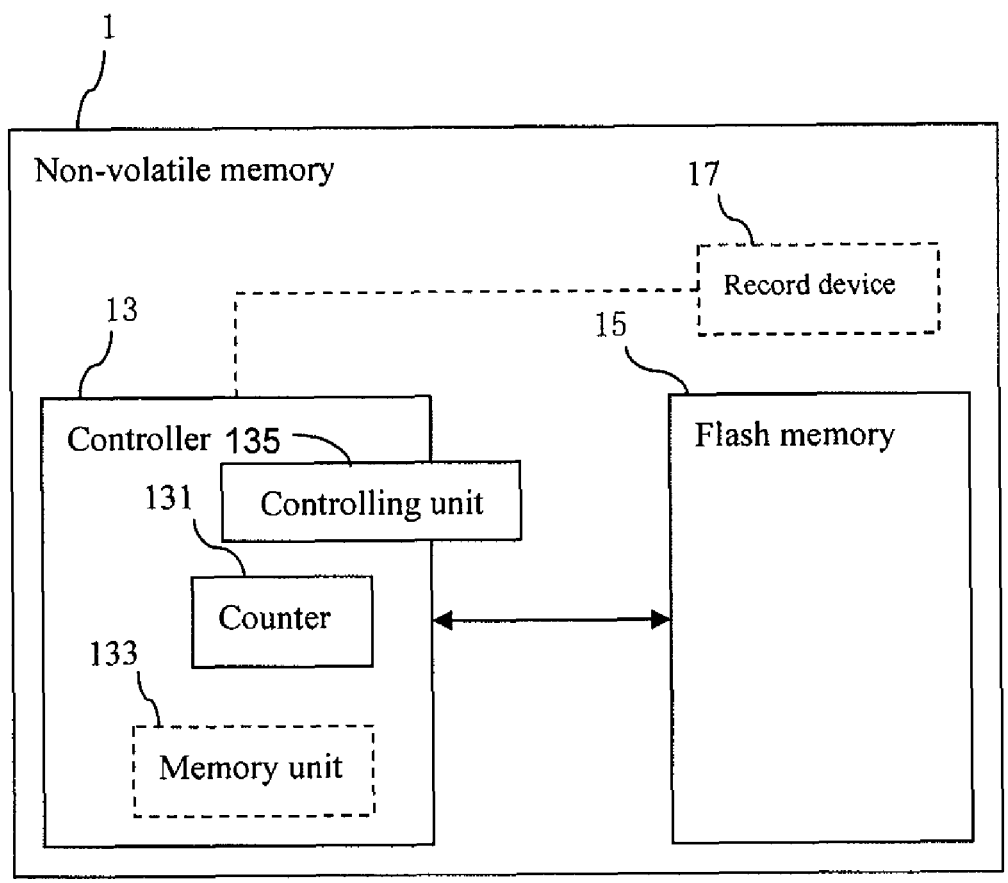
FIG. 7 is a schematic drawing showing the structure of a non-volatile memory according to one embodiment.

If δ1<δr<δ2, step S119 will be chosen and the controlling device of the flash memory can start a static wear leveling cycle after the actual erase counts for some memory blocks have reached a first predetermined value (E1) and move the static data stored in the corresponding memory blocks (B1). If δ2≦δr<δ3, step S129 will be chosen and the controlling device of the flash memory can start a static wear leveling cycle after the actual erase counts for some memory blocks have reached a second predetermined value (E2) and move the static data stored in the corresponding memory blocks (B2). If δr>δ3, step S139 will be chosen and the controlling device of the flash memory can start a static wear leveling cycle after the actual erase counts for some memory blocks have reached a third predetermined value (E3) and move the static data stored in the corresponding memory blocks (B3), wherein B0<B1<B2<B3 and E0>E1>E2>E3. FIG. 7 shows the internal structure of a flash memory in accordance with one embodiment.

Since the static wear leveling action will move the static data in the original memory blocks to the new memory blocks so as to release the original memory blocks, it is desirable to ensure that the data stored in the original memory blocks is the static data prior to moving the static data. Otherwise, the controlling device of the flash memory may wrongly define the dynamic data stored in the memory blocks with a low erase count as the static data, and therefore the static wear leveling action may wrongly move the dynamic data stored in the memory blocks with a low erase count to the memory blocks with a high erase count. As a result, the memory blocks with a high erase count will be repeatedly erased and rewritten and will have a shorter lifetime. Therefore, the above embodiment provides a method of determining whether the data stored in the memory blocks with a low erase count is the static data or not while ensuring that the data to be moved by the static wear leveling action is the static data.

Referring to FIG. 7, a flash memory according to one embodiment includes a controlling device 13, a flash memory device 15, and a record device 17 for recording the actual erase counts of the memory blocks in the flash memory device 15. The controlling device 13 includes a controlling unit 135 for controlling the record device 17, a counter 131 for accumulating the sum of the actual erase counts for all the memory blocks, and a memory unit 133.

Figures 8A, 8B:
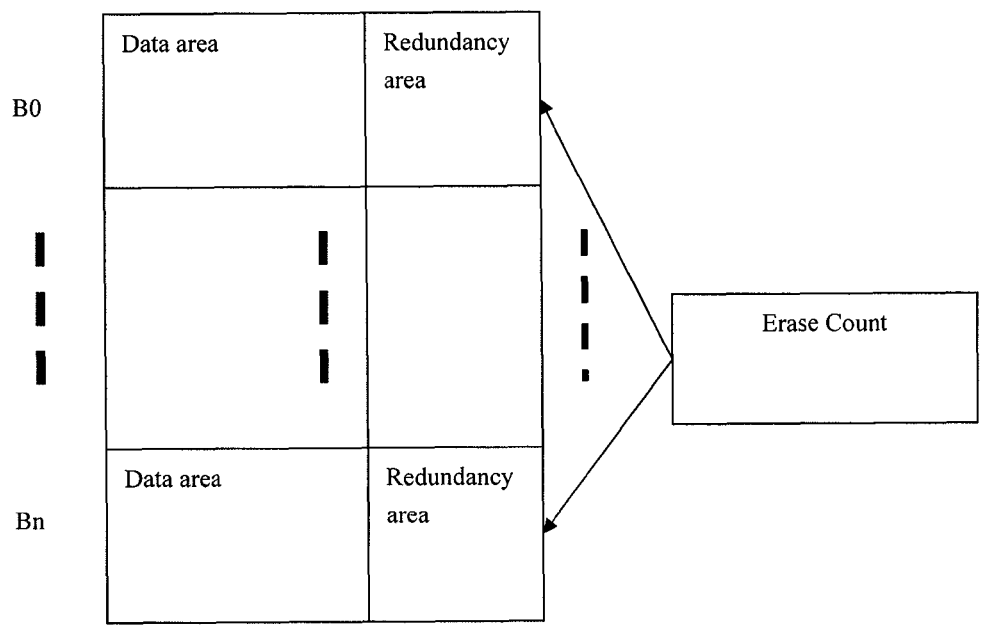
FIG. 8a is schematic drawing showing the logic structure of non-volatile memory according to another embodiment.
FIG. 8b is schematic drawing showing the logic structure of a memory block according to yet another embodiment.

Referring FIGS. 8a and 8b, the memory unit 133 of the controlling device 13 is used to record the latest erasing time (ET) of each memory block, and the actual ET of each memory block is stored in the redundancy area of the corresponding memory block. Calculating ET of each memory block in the flash memory with the sum of the actual erase counts of all memory blocks in the flash memory, the bigger the difference between the sum of the actual erase counts and corresponding ET is, the longer the memory block with the comparing ET was not erased. In this way, the memory block having the longest time without erasing can be found and can be defined as the memory block for storing the static data, and consequently the data stored in such memory block can be moved and rewritten in coming static wear leveling action. The following example shows how this scheme works.

Figure 9:
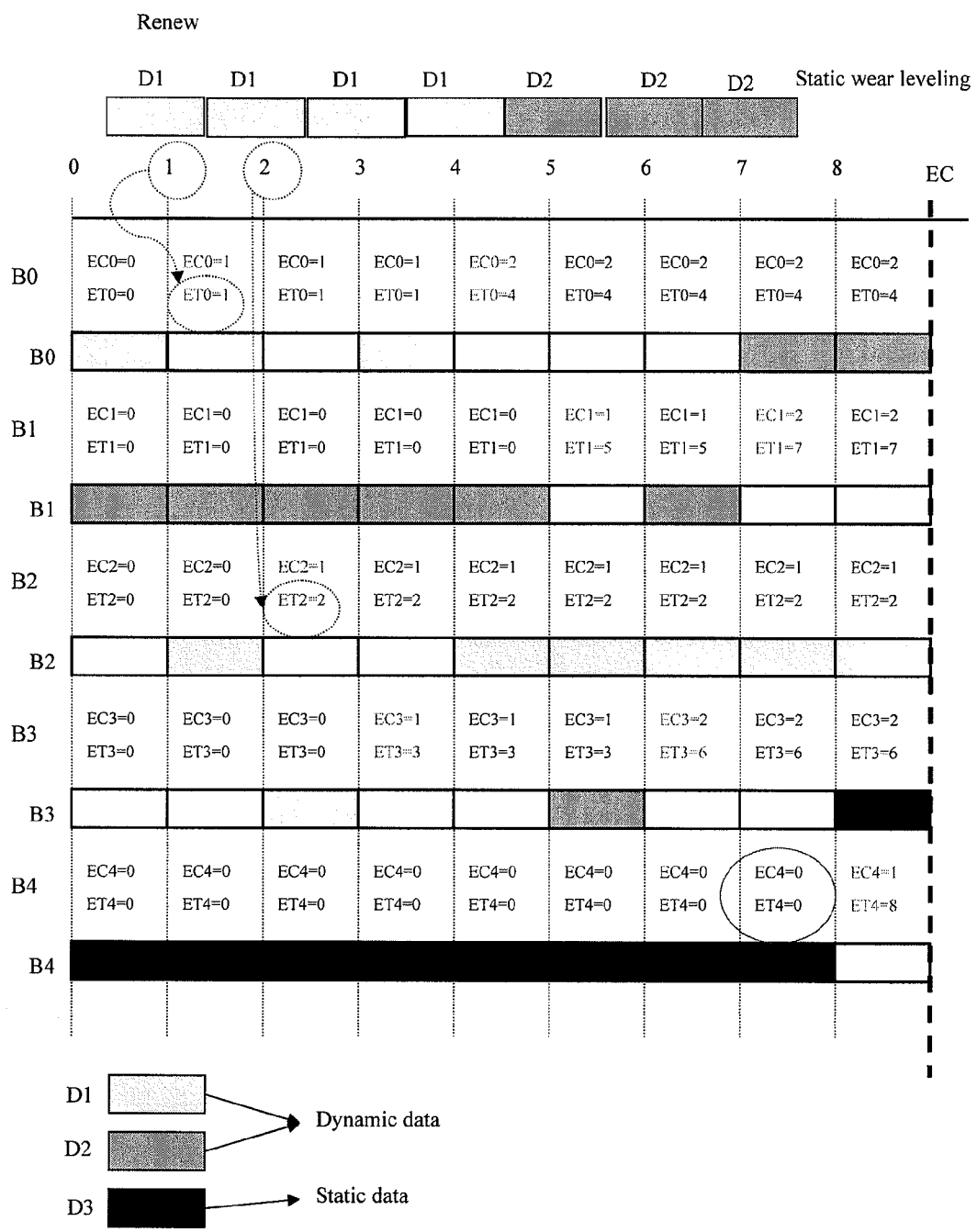
FIG. 9 is schematic drawing showing the status of the memory blocks after a first static wear leveling action.
Figure 10:
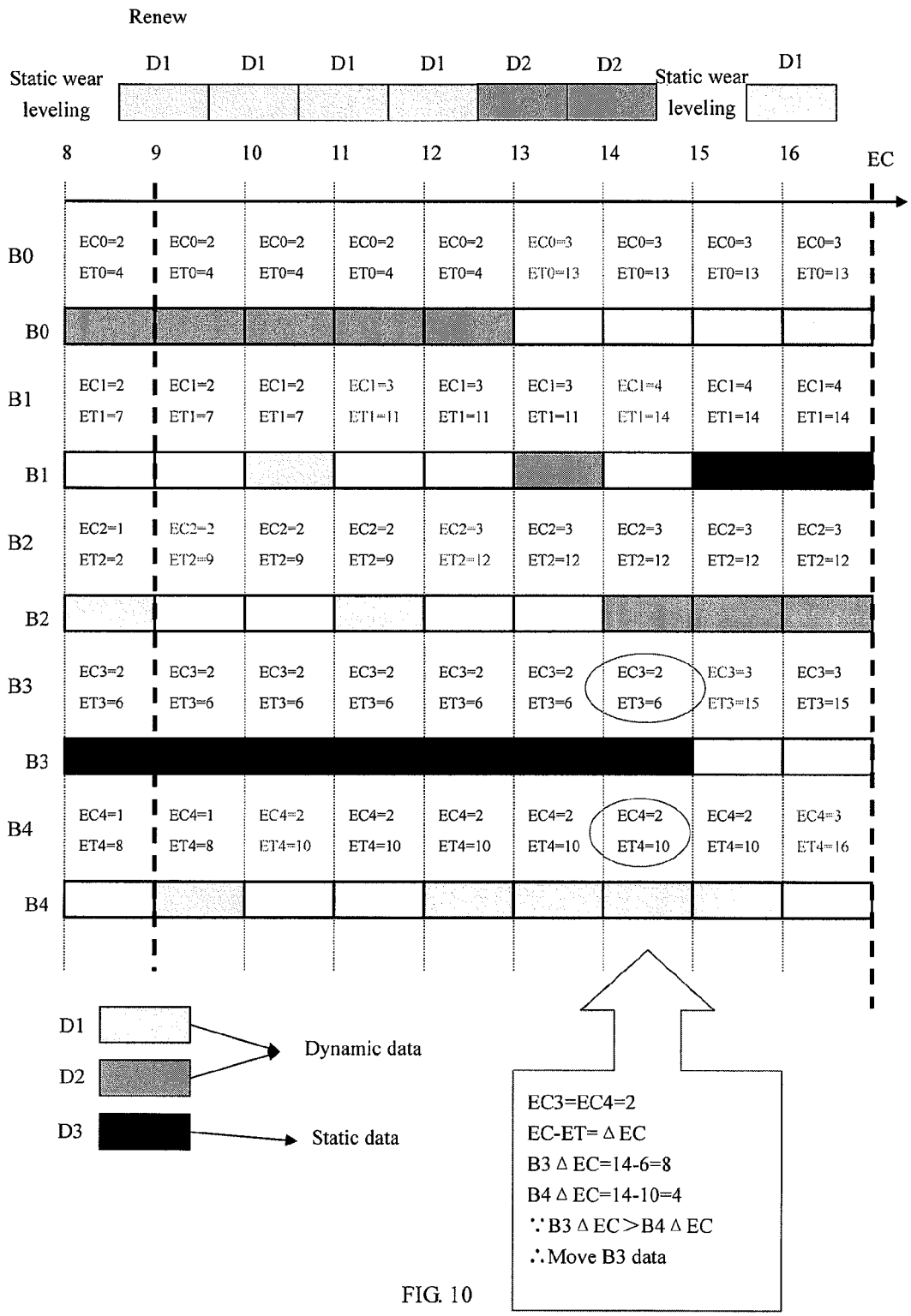
FIG. 10 is schematic drawing showing the status of the memory blocks after a second static wear leveling action.
Figure 11:
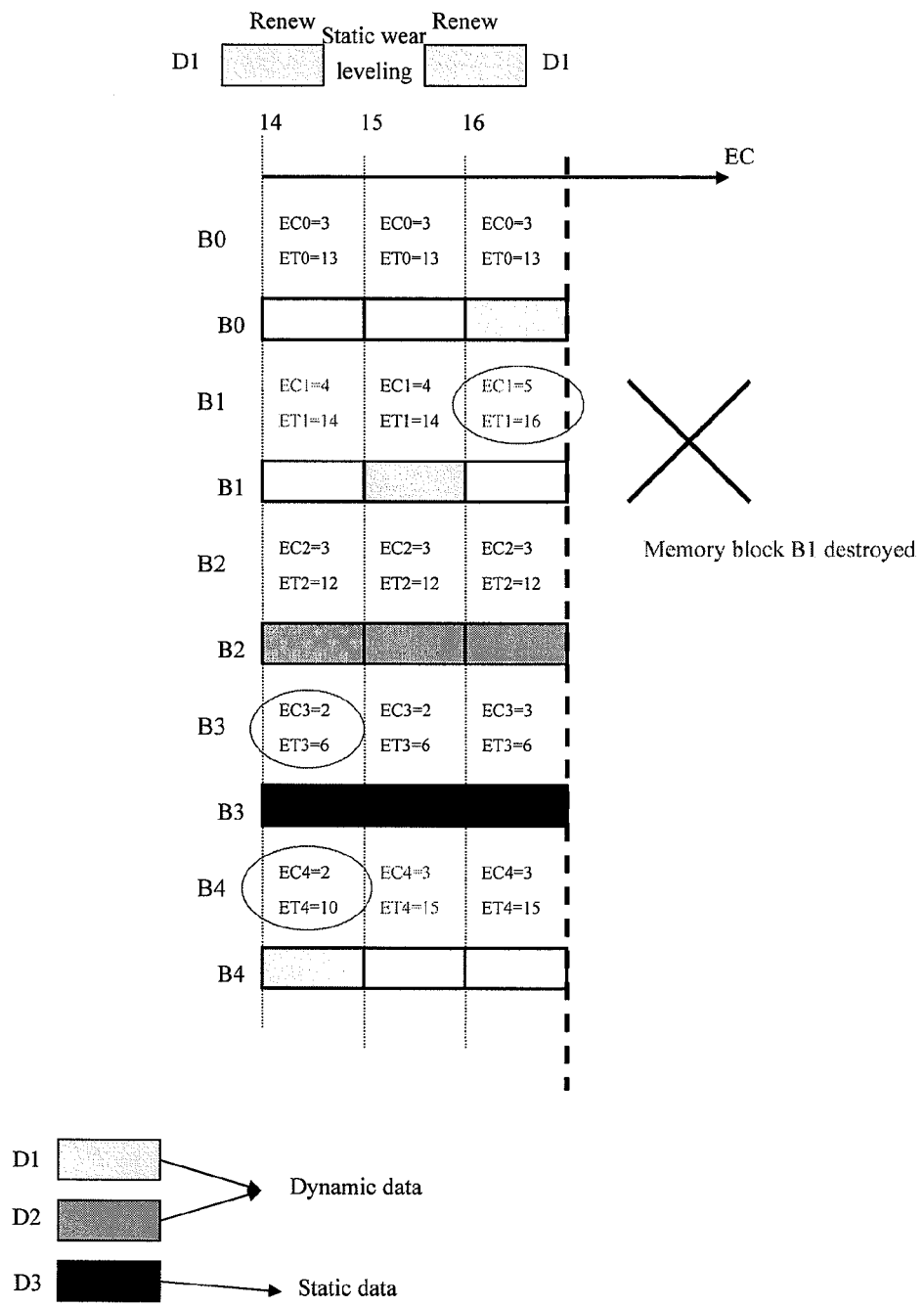
FIG. 11 is schematic drawing showing the status of the memory blocks after another second static wear leveling action.

Referring to FIGS. 9 and 10, five memory blocks B0, B1, B2, B3 and B4 are provided. Initially, the actual erase count for each of the memory blocks B0, B1, B2, B3 and B4 is zero. A first data D1 and a second data D2 are presumed as dynamic data and are originally stored in the memory block B0 and the memory block B1, respectively. A third data D3 is presumed as static data and is originally stored in the memory block B4. The memory blocks B2 and B3 are preset as free block with no data stored therein.

When a first new data D1 is written into the flash memory, the controlling device 13 stores the new data D1 in the memory block B2 and erases the memory block B0, and the actual erase count for the flash memory B0 is recorded as EC0=1 in the record device 17 and the latest ET for the memory block B0 is recorded as ET0=1 in the counter 131 of the controlling device 13. When a second new data D1 is written into the flash memory, the controlling device 13 stores the new data D1 in the memory block B3 and erases the memory block B2, and the actual erase count for the flash memory B2 is recorded as EC2=1 in the record device 17 and the latest ET for the memory block B2 is recorded as ET2=2 in the counter 131 of the controlling device 13.

Following the order, a third new data D1, a fourth new data D1, a fifth new data D2, a sixth new data D2, and a seventh new data D2 are written into one of the memory blocks one by one. When the sum of the actual erase counts in the flash memory reaches seven (7), the actual erase count of the memory block B0 is EC0=2 and the latest ET of the memory block B0 is ET0=4. The actual erase count of the memory block B1 is EC1=2 and the latest ET of the memory block B 1 is ET1=7. The actual erase count of the memory block B2 is EC2=1 and the latest ET of the memory block B2 is ET2=2. The actual erase count of the memory block B3 is EC3=2 and the latest ET of the memory block B3 is ET3=3. The actual erase count of the memory block B4 is EC0=0 and the latest ET of the memory block B4 is ET0=0. The data stored in the memory block B4 has never been erased and rewritten.

In order to evenly make use of all the memory blocks in the flash memory, the third new data D3 stored in the memory block B4 is moved to be stored in the empty memory block with the biggest EC. In this embodiment, the memory block B3 has the biggest EC, and therefore the third new data D3 is moved from the memory block B4 to the memory block B3, and at the same time the data stored in the memory block B4 is erased and its storage status is renewed, and accordingly the latest erase count and ET of the memory block B4 is EC4=1 and ET4=8.

By comparing differences between the actual ETs of memory blocks and the overall ET, it can be determined whether the data stored in the memory stock has not been erased for a long time, and accordingly it can be determined whether the memory stock is storing the static data, so as to decrease the possibility of moving the dynamic data stored in the memory blocks which has a low erase count.

Referring to FIG. 10, after a first static wear leveling cycle and when the overall erase count reaches four (4), the erase count and ET of the memory blocks B0~B4 are respectively EC0=3 and ET0=13, EC1=4 and ET1=14, EC2=3 and ET2=12, ET3=6, and EC4=2 and ET4=10.

It can be seen that the memory blocks B3 and B4 has the smallest EC, namely two times. For the memory block B3, the difference between the actual ET3 of the memory block and the overall ET is: B3ΔEC=14-6=8. For the memory block B4, the difference between the actual ET4 of the memory block and the overall ET is: B4×EC=14-10=4. It can be seen that the memory block B3 has a longer time without erasing action, and therefore the data stored in the memory block B3 is regarded as the static data. Therefore, during the static wearing leveling cycle, the static data stored in the memory block B3 is moved to the memory block B1 which has the highest EC, so as to decrease a possibility of erasing the memory block B1 in the following static wear leveling cycles.

Figure 12:
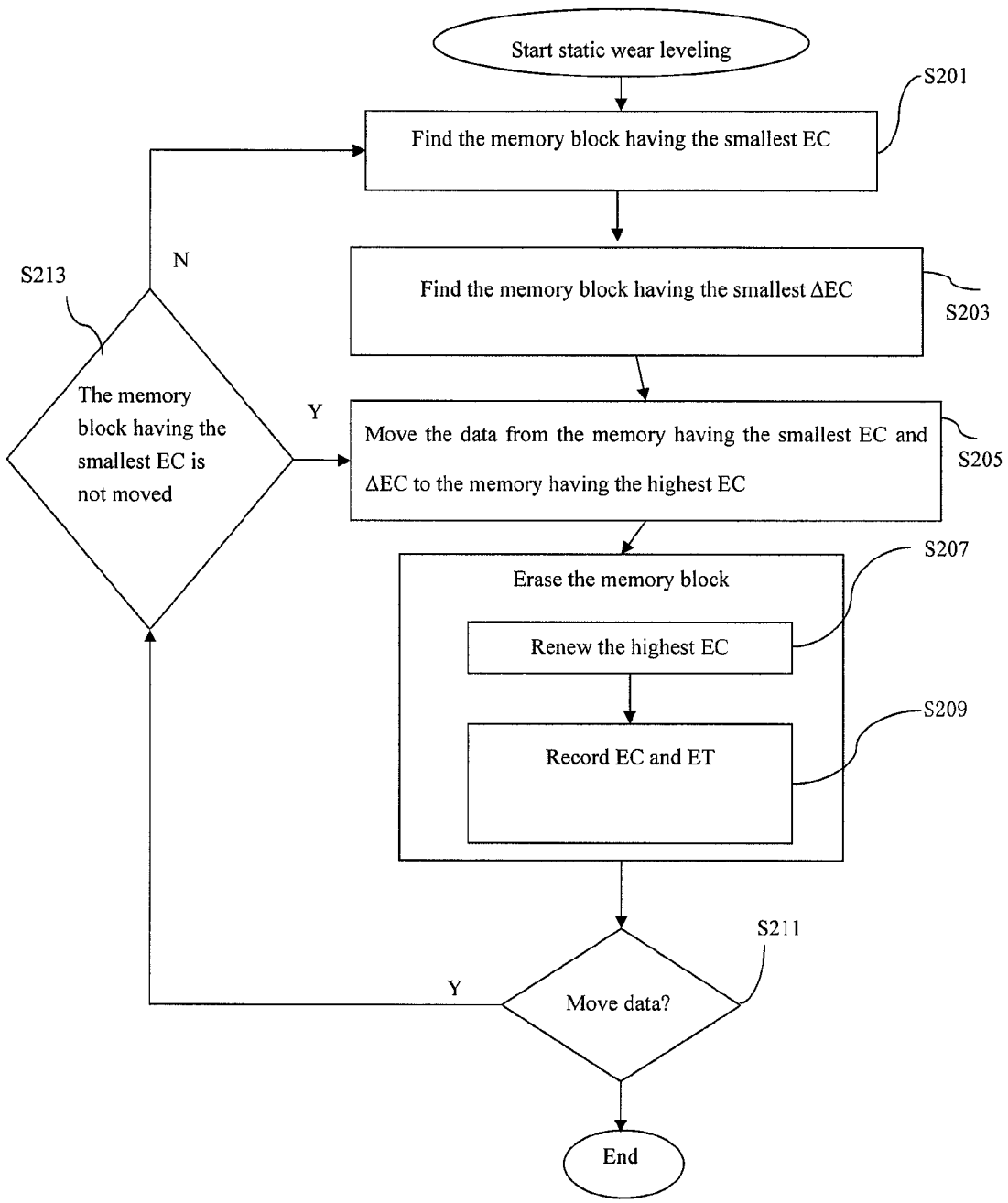
FIG. 12 is a flow chart showing the way of the static wear leveling cycle, following the flow chart of FIG. 6.

FIG. 12 shows the flow chart of the static wear leveling cycle according to one embodiment, which shows steps following the steps shown in the flow chart of FIG. 6. From Step S201 to Step 209, it shows how the memory block with the static data is found and how the static data stored in the memory block is moved to another memory block, and how the steps is repeated and ended.

While the invention has been shown and described with respect to embodiments thereof, this is for the purpose of illustration rather than limitation, and other variations and modifications of the embodiments herein shown and described will be apparent to those skilled in the art and are within the scope of the invention. For instance, the type of memory in the above embodiments is flash memory. The embodiments can also apply to other types of memories such as EPROM (Erasable Programmable Read Only Memory), EEPROM (Electrically Erasable Programmable Read Only Memory), PRAM (Phase-change Random Access Memory), MRAM (Magnetic Random Access Memory), and FRAM (Ferroelectric Random Access Memory).

What is claimed is:

1. A method of controlling a non-volatile memory comprising a plurality of memory blocks storing static data, the method comprising:
   calculating an erase count (EC) of each of the memory blocks; and
   calculating a standard deviation of the erase counts to decide a way of a static wear leveling cycle;
   wherein the way of a static wear leveling cycle comprises:
      setting at least one predetermined threshold point; and
      judging whether the standard deviation of the erase counts is bigger than the predetermined threshold point;
   wherein, if the standard deviation of the erase counts is bigger than the predetermined threshold point, the static wear leveling cycle starts; and
   wherein, if the standard deviation of the erase counts is not bigger than the predetermined threshold point, the static wear leveling cycle does not start;
   wherein the static data comprises data adapted to be rewritten very few or never rewritten, including a procedure code of an operating system.

2. The method of claim 1, wherein the static wear leveling cycle moves the static data stored in a memory block to another memory block having the highest EC, and erases the memory block.

3. A non-volatile memory comprising:
   a plurality of memory blocks; and
   a static wear leveling device including:
      a memory unit configured to store erase counts of the memory blocks; and
      a controlling unit configured to obtain the erase counts from the memory unit, to calculate a standard deviation based on the erase counts, and to decide a way of a static wear leveling cycle based at least partly on the standard deviation;
   wherein the controlling unit is configured to decide the way of the static wear leveling cycle, the way comprising:
   setting at least one predetermined threshold point; and
   judging whether the standard deviation of the erase counts is smaller than the predetermined threshold point;
   wherein, if the standard deviation of the erase counts is smaller than the predetermined threshold point, the static wear leveling cycle starts for a first amount of cycles and moves static data stored a first number of memory blocks;
   wherein, if the standard deviation of the erase counts is bigger than the predetermined threshold point, the static wear leveling cycle starts for a second amount of cycles and moves static data stored a second number of memory blocks.

4. The non-volatile memory of claim 3, wherein the first number is zero.

5. The non-volatile memory of claim 3, wherein the first amount is bigger than the second amount and the first number is smaller than the second number.

* * * * *